United States Patent [19]
Imaizumi et al.

[11] 3,977,920
[45] Aug. 31, 1976

[54] METHOD OF FABRICATING SEMICONDUCTOR DEVICE USING AT LEAST TWO SORTS OF INSULATING FILMS DIFFERENT FROM EACH OTHER

[75] Inventors: Ichiro Imaizumi; Tadao Kaji; Akio Hayasaka, all of Kokubunji; Keijiro Uehara, Tokyo, all of Japan

[73] Assignee: Hitachi, Ltd., Japan

[22] Filed: Aug. 23, 1974

[21] Appl. No.: 500,067

Related U.S. Application Data

[62] Division of Ser. No. 193,854, Oct. 29, 1971, Pat. No. 3,850,708.

[30] Foreign Application Priority Data

Oct. 30, 1970 Japan.................... 45-95083

[52] U.S. Cl................................ 148/187; 148/175
[51] Int. Cl.² ........................................ H01L 21/22
[58] Field of Search..................... 148/1.5, 175, 187

[56] References Cited
UNITED STATES PATENTS

| | | | |
|---|---|---|---|
| 3,342,650 | 9/1967 | Seki et al. ........................... | 148/187 |
| 3,484,313 | 12/1969 | Tauchi et al. ........................ | 148/187 |
| 3,660,735 | 5/1972 | McDougall ...................... | 148/1.5 X |
| 3,681,153 | 12/1970 | Clark et al. ........................ | 148/187 |
| 3,793,088 | 2/1974 | Eckton, Jr. ..................... | 148/187 X |
| 3,798,080 | 3/1974 | Henning et al. .................... | 148/187 |

*Primary Examiner*—L. Dewayne Rutledge
*Assistant Examiner*—J. M. Davis
*Attorney, Agent, or Firm*—Craig & Antonelli

[57] ABSTRACT

A lateral transistor or the like is made by the steps of forming a first insulating layer on a semiconductor substrate and providing a first hole in this insulating layer so as to expose a first surface portion of the substrate. An impurity of a first conductivity type is introduced through the hole and a second hole is formed in the insulating layer so as to expose a second surface portion of the substrate spaced apart from the first portion. Then, a second insulating layer of a material different from that of the first layer is formed on the first insulating layer and on the first and second surface portions of the substrate. Subsequently, third and fourth holes are formed in the second insulating layer within the confines of these holes to expose at least portions of the first and second surface portions of the substrate. Then, an impurity of a second conductivity type is introduced into the exposed first and second surface portions of the substrate through the third and fourth holes.

7 Claims, 9 Drawing Figures

METHOD OF FABRICATING SEMICONDUCTOR DEVICE USING AT LEAST TWO SORTS OF INSULATING FILMS DIFFERENT FROM EACH OTHER

CROSS REFERENCE TO RELATED APPLICATIONS

The present application is a division of application Ser. No. 193,854, filed Oct. 29, 1971, now U.S. Pat. No. 3,850,708.

BACKGROUND OF THE INVENTION

1. Field of the Invention

The present invention relates to a method of fabricating a semiconductor device, and more particularly to a method of fabricating a semiconductor device which uses at least two insulating films.

2. Description of the Prior Art

In methods of fabricating a semiconductor device which includes within an impurity diffusion region of a predetermined conductivity type, an impurity diffusion region of the opposite conductivity type, one has heretofore used the graft base transistor process in order, for example, to narrowly form the width of the emitter region of a bipolar transistor. As a concrete example of this process, U.S. Patent Application Ser. No. 517,648 describes a method of fabricating a semiconductor device, which method comprises the steps of forming an oxide film on a silicon substrate, forming a frame-shaped opening mask in the oxide film, performing the first impurity diffusion of high-concentration P-type impurities into the substrate through this mask, forming an oxide film to cover the opening portion, forming the second opening mask in the central mask portion of the frame-shaped opening mask, performing the second impurity diffusion of P-type impurities through the second opening mask, and performing the third impurity diffusion of high-concentration N-type impurities using the second opening mask "as is," so as to form the emitter of the semiconductor device.

With the above-mentioned method, however, it is necessary for the second impurity diffusion or the third impurity diffusion for the emitter region to process the oxide film to make the second opening mask, and a mask mis-register may occur in case of the mask positioning between the second mask and a base region with high concentration as has already been formed by the first impurity diffusion, thus making it impossible to form the emitter width narrowly and precisely.

SUMMARY OF THE INVENTION

An object of the present invention is to provide a method of fabricating a semiconductor device, which eliminates the above-mentioned disadvantages, which eliminates the danger of mask mis-register or misalignment and which permits to carry out the formation of impurity diffusion regions with good precision.

Another object of the present invention is to provide a method of fabricating a semiconductor device, which reduces the mask registering or aligning steps.

Still another object of the present invention is to provide a method of fabricating a semiconductor device, which permits to make small the area occupied by a transistor.

A method of the present invention for accomplishing the abovementioned objects is characterized by performing an impurity diffusion into a substrate through a mask formed of a first insulating film, subsequently forming a second insulating film in the area of an impurity diffusion region formed by the diffusion, and further, removing the first insulating film and using the second insulating film as a diffusion mask to perform another impurity diffusion. The invention will be hereinbelow described in detail with reference to a preferred embodiment and the accompanying drawings.

DESCRIPTION OF THE PREFERRED EMBODIMENTS

Figure 1A:
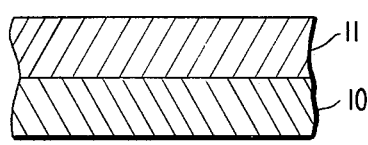
FIGS. 1a to 1i are diagrams of the fabricating steps of an embodiment of the present invention and showing sections of a lateral transistor.
Figure 1B:
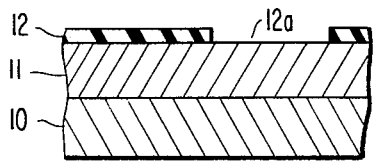
Figure 1C:
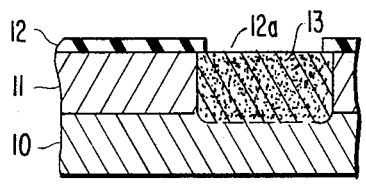
Figure 1D:
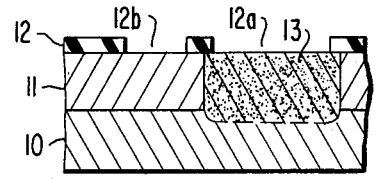
Figure 1E:
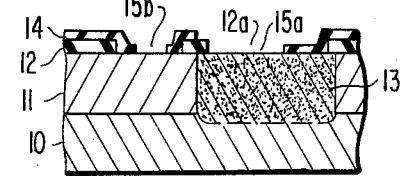
Figure 1F:
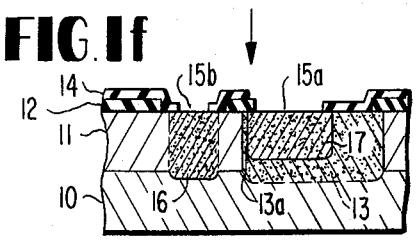
Figure 1G:
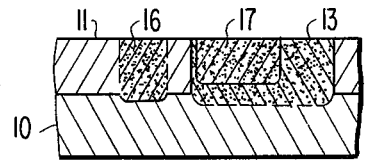
Figure 1H:
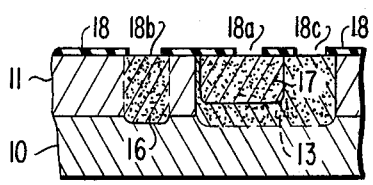
Figure 1I:
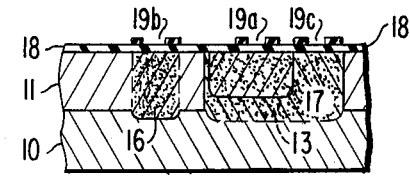

FIGS. 1a to 1i are diagrams showing an embodiment of the present invention, and illustrate the fabricating steps of a lateral transistor. The lateral transistor has its base width narrowly formed by utilizing the so-called double diffusion layer which includes, within an impurity diffusion layer of a predetermined conductivity type, an impurity diffusion layer of the opposite conductivity type. It is characterized in that the impurity diffusion is generally carried out in an atmosphere with no oxygen present. First, as shown in FIG. 1a, an epitaxial layer 11 (hereinafter referred to as "EP layer") is formed on a substrate 10, the EP layer 11 being opposite in the conductivity type to the substrate 10. As illustrated in FIG. 1b, an insulating film 12, e.g. a nitrided film ($Si_3N_4$), formed on the EP layer 11, is formed with a mask hole 12a for impurity diffusion using the photoetching technique. Used as an etching liquid in this case is, for example, phosphoric acid. Subsequently, as shown in FIG. 1c, an impurity diffusion region 13 is formed which penetrates through the EP layer 11 to reach the substrate 10 and which is the same conductivity type as that of the substrate. Next, as in FIG. 1d, a mask hole 12b is formed in a place separate from the diffused region 13. An insulating film, such as an oxide film 14, different in property from the nitrided film 12, is formed on the nitrided film 12 and in the mask holes 12a and 12b using a chemical deposition process (in general, the chemical vapor deposition), whereupon diffusion masks 15a and 15b are formed by the photo-etching technique as is illustrated in FIG. 1e. In this case, used as an etching liquid for the etching treatment are chemicals, such as fluoric acid, with which only the oxide film 14 is dissolved. With such treatment, the nitride film 12 previously formed is left as mask in the "as is" condition. Therefore, even if the mask hole 15a of the oxide film 14 is more or less misaligned, no problem results insofar as the nitride film 12 is partially exposed. Thus, the formation of impurity diffusion regions with predetermined accuracies becomes possible thereby. More specifically, as in FIG. 1f, impurities of the opposite conductivity type to that of the substrate are diffused through the diffusion mask holes 15a and 15b to form an emitter region 17 and a collector region 16 of high-concentration impurity diffusion portion, respectively. A base region 13a is precisely formed by the diffusion self-alignment, with the previously-formed nitride film 12 serving as a mask. Subsequently, as in FIG. 1f, the nitride and oxide films having been formed by the above steps are exfoliated and removed. As in FIG. 1h, a clean oxide film 18 for the stabilization and protection of the element is formed anew on the substrate and the diffused regions, and mask holes 18a, 18b and 18c for leading out electrodes are formed in the oxide film 18 using the photoetching technique. Finally, as shown in FIG. 1i, terminal lead-out electrodes 19a, 19b and 19c for the emitter, base and collector, respectively, are formed by the evaporation of a metal such as aluminum, to provide the lateral transistor.

The embodiment is characterized in that the semiconductor device is formed in a way in which impurity diffusion is made into a substrate through a mask formed by the first insulating film, the second insulating film different from the first one is subsequently formed on the mask, the formation of holes is suitably carried out, and thereafter, the impurity diffusion or the electrode application is performed.

As described above, the lateral transistor according to the steps of manufacture of this invention has the base region width 13a formed by the double diffusion using substantially an identical mask. Therefore, the width of the base region 13a may be accurately controlled. In addition, the electrode from the base region 13 can be easily lead out.

While, in the foregoing embodiment, description has been made of the case where two types of masks are subjected to etching treatments with different etching liquids and the case where two types of masks different in the etching speed with an identical etching liquid are used, it goes without saying that both cases are applicable to any embodiments. Furthermore, even in case where the two types of masks differ only in thickness, if the thickness of the first mask is sufficiently larger than that of the second mask and the thickness of the second mask is smaller than the diffusion depth, the first mask is hardly decreased even under a condition under which the second mask has been substantially completely etched away. Thus, a state similar to that in the third embodiment is brought about.

It is therefore apparent that the objects of the present invention may be accomplished when the two types of masks differ in material (for example, SiO$_2$, Si$_3$N$_4$, poly-Si, etc.), when they vary in constituents (for example, the thermal oxidation film, the CVD oxidation film, etc.), or when they differ in thickness. The techniques of the present invention are not restricted to the two types of masks mentioned above, but may of course be applied to a case of using more than two masks.

As described above in detail, the present invention carries out impurity diffusion through a diffusion mask formed by an insulating film, and in addition, uses the diffusion mask to form a mask on the first-mentioned mask or in a mask hole of an insulating film which is different in property from the first-mentioned insulating film, whereby precision impurity diffusion regions or electrode masks may be formed. Thus, the invention is greatly effective in providing a semiconductor device which is high in switching speed, exhibits no short-circuits and has excellent electrical characteristics.

While we have shown and described an embodiment in accordance with the present invention, it is understood that the invention is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. A method of fabricating a semiconductor device, comprising the steps of:
   a. preparing a semiconductor substrate;
   b. forming a first insulating layer on said substrate;
   c. forming a first hole in said first insulating layer so as to expose a first surface portion of said substrate;
   d. introducing an impurity of a first conductivity type into said first surface portion of said substrate exposed by said first hole;
   e. forming a second hole in said first insulating layer so as to expose a second surface portion of said substrate, spaced apart from said first surface portion;
   f. forming a second insulating layer on said first insulating layer and on said first and second surface portions of said substrate;
   g. forming third and fourth holes in said second insulating layer within the confines of said first and second holes, respectively, to thereby expose at least portions of said first and second surface portions of said substrate said third hole being formed in said second insulating layer so as to expose an edge part of the surface of said first insulating layer which delimits the confines of said first hole; and
   h. introducing an impurity of a second conductivity type, opposite said first conductivity type, into the exposed first and second surface portions of said substrate through said third and fourth holes.

2. A method of fabricating a semiconductor device according to claim 1, wherein said first insulating layer is silicon nitride and said second insulating layer is silicon oxide.

3. A method of fabricating a semiconductor device according to claim 1, wherein said second insulating layer is made of a material different from that of said first insulating layer.

4. A method of fabricating a semiconductor device according to claim 1, wherein step (a) comprises epitaxially forming a layer of semiconductor material of said second conductivity type onto a substrate semiconductor base layer of said first conductivity type, and wherein step (d) comprises introducing said impurity of said first conductivity type into the exposed first surface portion of said epitaxial layer so as to form a first semiconductor region of said first conductivity type which penetrates through said epitaxial layer and is contiguous with said substrate base layer.

5. A method of fabricating a semiconductor device according to claim 4, wherein step (h) comprises introducing said impurity of said second conductivity type into the exposed first and second surface portions of said epitaxial layer so as to form second and third semiconductor regions of said second conductivity type, said second region penetrating partially into said first region.

6. A method of fabricating a semiconductor device according to claim 1, wherein said steps (d) and (h) comprise diffusing said impurities into said substrate in an oxygen free atmosphere.

7. A method of fabricating a lateral transistor comprising the steps of:
   a. epitaxially forming a first semiconductor layer of a first conductivity type as the collector of said transistor on the surface of a semiconductor substrate of a second conductivity type;
   b. forming an Si$_3$N$_4$ layer on the surface of said first semiconductor layer;

c. forming a first hole in said Si$_3$N$_4$ layer so as to expose a first surface portion of said first semiconductor layer;
d. diffusing an impurity of said second conductivity type, in an oxygen-free atmosphere, into said first surface portion of said first semiconductor layer exposed by said first hole, so as to form a base region of said second cnductivity type which forms a first PN junction with said first semiconductor layer, said first PN junction terminating at the surface of said first layer upon which said Si$_3$N$_4$ layer is formed and penetrating through said first layer to said substrate;
e. forming a second hole in said Si$_3$N$_4$ layer apart from said first hole so as to expose a second surface portion of said first layer;
f. forming an SiO$_2$ layer on the surface of said Si$_3$N$_4$ layer and on the exposed surface of said first semiconductor layer;
g. forming third and fourth holes in said SiO$_2$ layer so as to expose at least portions of said first and second surface portions, respectively, of first semiconductor layer, said third hole exposing an edge of said Si$_3$N$_4$ layer which delimits the confines of said first hole;
h. diffusing impurities of said first conductivity type into said first and second surface portions of said first semiconductor layer exposed by said third and fourth holes, so as to form respective emitter and collector contact regions, said emitter region forming a second PN junction with said base region, the termination of said second PN junction at the surface of said first layer, nearest the termination of said first PN junction, being beneath said Si$_3$N$_4$ layer so that the distance between the termination of said first and second PN junctions at said Si$_3$N$_4$ layer defines the base width of said lateral transistor; and
i. providing electrode contacts on said base, emitter and collector contact regions.

* * * * *